US012428735B2

(12) United States Patent
Spiegelman et al.

(10) Patent No.: US 12,428,735 B2
(45) Date of Patent: *Sep. 30, 2025

(54) SUPPRESSION OF HYDROGEN DEGRADATION

(71) Applicant: RASIRC, Inc., San Diego, CA (US)

(72) Inventors: Jeffrey J. Spiegelman, San Diego, CA (US); Daniel Alvarez, Jr., Vista, CA (US)

(73) Assignee: RASIRC, Inc., San Diego, CA (US)

( * ) Notice: Subject to any disclaimer, the term of this patent is extended or adjusted under 35 U.S.C. 154(b) by 297 days.

This patent is subject to a terminal disclaimer.

(21) Appl. No.: 17/806,040

(22) Filed: Jun. 8, 2022

(65) Prior Publication Data
US 2022/0298648 A1 Sep. 22, 2022

Related U.S. Application Data

(63) Continuation of application No. 17/447,016, filed on Sep. 7, 2021, now Pat. No. 11,359,292, which is a continuation of application No. PCT/IB2021/052910, filed on Apr. 8, 2021.

(60) Provisional application No. 63/009,915, filed on Apr. 14, 2020.

(51) Int. Cl.
*C23F 11/18* (2006.01)
(52) U.S. Cl.
CPC ..................... *C23F 11/18* (2013.01)
(58) Field of Classification Search
CPC ....................................................... C23F 11/18
See application file for complete search history.

(56) References Cited

U.S. PATENT DOCUMENTS

| 8,282,708 B2 | 10/2012 | Spiegelman et al. |
| 9,545,585 B2 | 1/2017 | Alvarez et al. |
| 10,363,497 B2 | 7/2019 | Spiegelman et al. |

(Continued)

FOREIGN PATENT DOCUMENTS

| JP | 2010181872 A | 8/2010 |
| JP | 2010192503 A | 9/2010 |

(Continued)

OTHER PUBLICATIONS

Notice of Allowance dated Nov. 4, 2024, for Taiwan patent application No. 110113260.

(Continued)

*Primary Examiner* — Peter F Godenschwager
(74) *Attorney, Agent, or Firm* — MLO, a professional corp.

(57) ABSTRACT

The present disclosure provides techniques for suppression of hydrogen degradation. In some embodiments, a method for decreasing an amount or rate of hydrogen degradation of a material, includes: (a) exposing a material to gaseous hydrogen peroxide; and (b) forming a hydroxyl layer on the surface of the material within a chamber. The hydroxyl layer can decrease an amount or rate of hydrogen degradation of the material when exposed to hydrogen. In some embodiments, a system includes: a chamber; a material within the chamber; an inlet to the chamber; a hydrogen peroxide source coupled to the inlet via a conduit; and an outlet from the chamber for removing species from the chamber. The system can be configured to perform the method for decreasing an amount or rate of hydrogen degradation of a material.

25 Claims, 8 Drawing Sheets

(56) References Cited

U.S. PATENT DOCUMENTS

| | | | |
|---|---|---|---|
| 11,359,292 B2* | 6/2022 | Spiegelman | ........ C23C 16/4404 |
| 2003/0209290 A1 | 11/2003 | Heimann et al. | |
| 2007/0221641 A1 | 9/2007 | Hackel et al. | |
| 2010/0098885 A1 | 4/2010 | Vontell et al. | |
| 2011/0175078 A1 | 7/2011 | Kim et al. | |
| 2017/0263436 A1 | 9/2017 | Brown et al. | |
| 2019/0148238 A1 | 5/2019 | Lu et al. | |
| 2020/0291517 A1 | 9/2020 | Blethen et al. | |
| 2020/0393086 A1 | 12/2020 | Blethen et al. | |

FOREIGN PATENT DOCUMENTS

| | | | |
|---|---|---|---|
| JP | 2013068934 A | 4/2013 | |
| JP | 2020500695 A | 1/2020 | |
| KR | 20100032153 A | 3/2010 | |
| TW | 201801177 A | 1/2018 | |
| TW | 201938832 A | 10/2019 | |
| WO | 2016164380 A1 | 10/2016 | |
| WO | 2017027581 A1 | 2/2017 | |
| WO | 2019169335 A1 | 9/2019 | |

OTHER PUBLICATIONS

Office Action dated Oct. 29, 2024 for Japan Patent Application No. 2022-562307.

European Search Report dated Jul. 9, 2024 for European Patent Office Patent Application No. 21787749.7.

Wang J et al: "Effects of boron on water dissociation and surface diffusivity of hydrogen on Ni3(Al, Ti)(110) single crystal surfaces", Intermetallics, Elsevier Science Publishers B.V, GB, vol. 9, No. 4, Apr. 1, 2001 (Apr. 1, 2001), pp. 349-354, XP004234438, ISSN: 0966-9795, DOI: 10.1016/S0966-9795(01)00010-3.

Bhadeshia, Prevention of Hydrogen Embrittlement in Steels, ISIJ International vol. 56, No. 1, pp. 24-36, Jan. 2016.

Choi et al., Formation and suppression of hydrogen blisters in tunnelling oxide passivating contact for crystalline silicon solar cells. Sci Rep 10, 9672, Jun. 2020, 15 pages, https://doi.org/10.1038/s41598-020-66801-4.

Edmonds et al., Self-limiting CVD of a passivating SiOx control layer on InGaAs(001)-(2x4) with the prevention of III-V oxidation, Surface Science 66, Feb. 2017, pp. 31-38.

International Search Report and Written Opinion dated Jul. 14, 2021 for PCT Patent Application No. PCT/IB2021/052910.

Kaufman-Osborn et al., Atomic imaging and modeling of passivation, functionalization, and atomic layer deposition nucleation of the SiGe(001) surface via H2O2(g) and trimethylaluminum dosing, Surface Science, 630, Sep. 2014, pp. 273-279.

Notice of Allowance and Fees dated Feb. 23, 2022 for U.S. Appl. No. 17/447,016.

Office Action dated Jan. 26, 2022 for U.S. Appl. No. 17/447,016.

Sk et al. "Hydrogen embrittlement of 4340 steel due to condensation during vaporized hydrogen peroxide treatment" Materials Science and Engineering A, 528, 2011, 3639-3645. (Year: 2011).

\* cited by examiner

SUPPRESSION OF HYDROGEN DEGRADATION

RELATED APPLICATIONS

This application is a continuation of U.S. Non-Provisional patent application Ser. No. 17/447,016, filed on Sep. 7, 2021 and entitled "Suppression of Hydrogen Degradation"; which is a continuation of PCT International Application No. PCT/IB2021/052910, filed on Apr. 8, 2021 and entitled "Suppression of Hydrogen Degradation", which claims priority to U.S. Provisional Application No. 63/009,915, filed on Apr. 14, 2020 and entitled "Active Suppression of Hydrogen Embrittlement"; the contents of which are hereby incorporated by reference in full.

BACKGROUND

The demand for faster, smaller and more energy efficient logic devices as well as higher density, higher speed, and increased reliability for advanced memory devices has led to numerous challenges in semiconductor device manufacturing. Novel metal materials, 3D architecture and increasing high-aspect-ratio (HAR) structures are being used to address these challenges, however this has placed additional demands on photolithography, film deposition and film etch methods.

Various process gases may be used in the manufacturing and processing of micro-electronics. In addition, a variety of chemicals may be used in other environments demanding high purity gases, e.g., controlled processes or applications, including without limitation microelectronics applications, wafer patterning, atomic layer deposition, chemical vapor deposition, etch and selective etch, wafer cleaning, wafer bonding, photoresist stripping, silicon oxidation, surface passivation, photolithography mask cleaning, flat panel displays, industrial parts cleaning, pharmaceutical manufacturing, production of nano-materials, power generation and control devices, fuel cells, power transmission devices, and other applications in which process control and purity are important considerations. In those processes and applications, it is necessary to deliver specific amounts of certain process gases under controlled operating conditions, e.g., temperature, pressure, flow rate and various plasma conditions.

However, it is known that high energy light intensity, high temperature, and high energy plasma processes produce hydrogen radicals, or excited state hydrogen species that result in hydrogen embrittlement of metals and metal-oxides over time. Hydrogen embrittlement especially with atomic hydrogen causes premature failure of metals and metal-oxide surface coatings which leads to degradation of desirable mechanical and physical properties. This is especially true in the semiconductor industry on any stainless steel or metal-oxide coated surfaces. Stainless steel and other metals are commonly used for construction of process chambers, internal chamber parts, sensors, susceptors, heaters, mirrors, showerheads and robots. These materials may or may not be coated with metal-oxides for corrosion resistance, antireflective coatings, or to ensure process inertness. As a result of hydrogen embrittlement, these manufacturing processes must occasionally or frequently be stopped to allow for maintenance and/or replacement of metal components that have degraded over time, causing delays in production, contamination of the process or the process chamber, lower manufacturing throughput and lost profits over time.

Presently, exposure to water and oxygen in ambient air may lead to passivated surfaces that offer some protection to metal surface embrittlement by hydrogen. However, water and oxygen may lead to non-uniform surface coatings and in some instances may damage metal material by deeply penetrating the material (sub-surface oxidation). These sub-surface oxides may detrimentally change the physical and mechanical properties of the metal surface exposed to the atomic hydrogen.

SUMMARY

The present disclosure provides techniques for suppression of hydrogen degradation. In some embodiments, a method for decreasing an amount or rate of hydrogen degradation of a material includes: (a) exposing a material to gaseous hydrogen peroxide; (b) forming a hydroxyl layer on the surface of the material within a chamber; and (c) after forming the hydroxyl layer, exposing the material to hydrogen during a controlled process or application.

In some embodiments, a method for decreasing an amount or rate of hydrogen degradation of a material includes: (a) exposing a material to gaseous hydrogen peroxide; and (b) forming a hydroxyl layer on a surface of the material within a chamber, wherein the hydroxyl layer decreases an amount or rate of hydrogen degradation of the material when exposed to hydrogen.

In some embodiments, a system includes: a chamber; a material within the chamber; an inlet to the chamber; a hydrogen peroxide source coupled to the inlet via a conduit; and an outlet from the chamber for removing species from the chamber. The system can be configured to perform a method for decreasing an amount or rate of hydrogen degradation of a material, the method comprising: (a) exposing the material to gaseous hydrogen peroxide from the hydrogen peroxide source; and (b) forming a hydroxyl layer on a surface of the material within the chamber, wherein the hydroxyl layer decreases an amount or rate of hydrogen degradation of the material when exposed to hydrogen.

DETAILED DESCRIPTION

Figure 1:
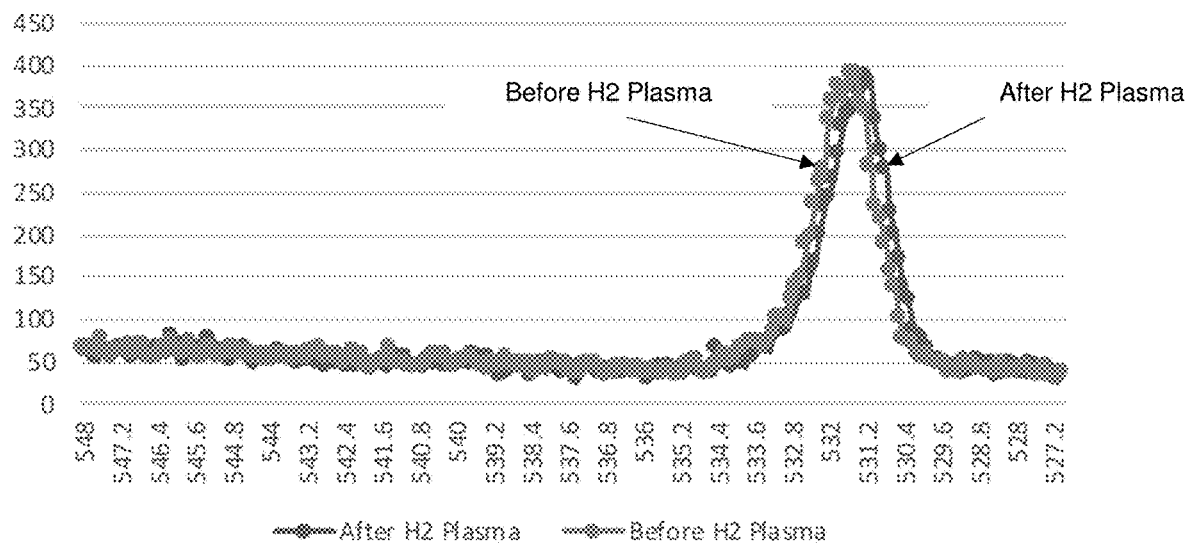
FIG. 1 is a graphical diagram showing the results after 12 h $H_2$ plasma wherein the oxygen 1s peak shifted to lower binding energy, in accordance with some embodiments.

The present disclosure relates generally to metal degradation and more specifically to the use of hydroxyl groups to decrease the amount of hydrogen degradation of a material resulting from exposure to hydrogen. In some embodiments, a material (e.g., a metal and/or a metal oxide film) is exposed to hydrogen peroxide (e.g., in a mixed gas with or without water vapor), and the hydrogen peroxide forms a hydroxyl layer on the material, which decreases the amount of hydrogen degradation of the material when the material is exposed to hydrogen (e.g., hydrogen gas, hydrogen atoms, hydrogen ions, hydrogen radicals, or hydrogen plasma). In some cases, hydrogen peroxide dosing may be used to treat a material (e.g., that is part of an article or device) used in a process that exposes the material (e.g., a metal or metal-oxide coated surface) to hydrogen, ultraviolet-light (UV-light), infrared radiation, reducing atmospheres, elevated temperature, or combinations thereof, to prevent hydrogen degradation of the material. In some cases, the material is exposed to hydrogen during a controlled process or application.

Conventional solutions typically focus on material selection or surface coatings to prevent hydrogen degradation (e.g., from hydrogen and hydrogen plasmas that are used to create a reducing atmosphere). Hydrogen peroxide creates an oxidizing environment and would therefore typically be considered incompatible with the hydrogen process chemistry. Additionally, the ability to deliver a controlled and consistent concentration of an active hydroxyl species (e.g., hydrogen peroxide in a mixed gas) is difficult. Systems and methods to deliver hydrogen peroxide are further described in U.S. Pat. Nos. 8,282,708, 9,545,585, and 10,363,497; U.S. Pat. Pub. Nos. US20200291517A1, and US20200393086A1; and International Pub. Nos. WO2016/164380 and WO2017/027581, each of which is incorporated herein by reference in their entireties. The present disclosure describes techniques for the suppression of hydrogen degradation (e.g., hydrogen embrittlement) at the surface, sub-surface, and in the bulk of the material. In some cases, the hydrogen peroxide is provided using the systems and methods described in the above patents and patent publications.

Before the present compositions and methods are described, it is to be understood that this invention is not limited to particular compositions, methods, and experimental conditions described, as such compositions, methods, and conditions may vary. It is also to be understood that the terminology used herein is for purposes of describing particular embodiments only, and is not intended to be limiting, since the scope of the present invention will be limited only in the appended claims.

As used in this specification and the appended claims, the singular forms "a", "an", and "the" include plural references unless the context clearly dictates otherwise. Thus, for example, references to "the method" includes one or more methods, and/or steps of the type described herein which will become apparent to those persons skilled in the art upon reading this disclosure and so forth.

As used in this specification and the appended claims, the term "about" refers to a +/−5% variation. For example, about 100° C., refers to a temperature from 95° C. to 105° C.

The term "controlled process or application," as used herein, refers to a process or application in which process control and/or purity are important considerations. Examples of controlled processes and applications include without limitation microelectronics applications, photolithography, wafer patterning, atomic layer deposition, chemical vapor deposition, selective etch, wafer cleaning, wafer bonding, photoresist stripping, silicon oxidation, surface passivation, photolithography mask cleaning, exposure to UV light, disinfection of surfaces contaminated with bacteria, viruses and other biological agents, industrial parts cleaning, pharmaceutical manufacturing, hydrogenation reactions, production of nano-materials, power generation and control devices, fuel cells, power transmission devices, and any processes that expose metal or metal-oxide surfaces to hydrogen or hydrogen radicals.

The term "dosing," as used herein, refers to the introduction of a species into an environment. For example, dosing a metal or metal oxide surface with hydrogen peroxide gas at a 50 ms pulse length, refers to introducing hydrogen peroxide gas into an environment (e.g., a vacuum chamber) containing the metal or metal oxide for a duration of 50 ms.

The term "hydrogen degradation" as used herein refers to the degradation of a material that is exposed to hydrogen (e.g., $H_2$, hydrogen atoms, hydrogen ions, hydrogen radicals, or hydrogen plasma). "Hydrogen degradation" can include hydrogen embrittlement, cracking, surface degradation of the material, blistering of the material, delamination of a layer from another layer or from the bulk of a material, and/or the formation of particles on or from the material.

The term "langmuir," as used herein, refers to a unit of exposure (or dosage) to a surface. It can be derived by multiplying the pressure of the gas by the time of exposure (e.g., one langmuir corresponds to an exposure of $10^{-6}$ Torr during one second).

In some embodiments, a hydroxyl layer is formed on a material by exposing the material to hydrogen peroxide. In some cases, the hydrogen peroxide is substantially anhydrous. In practice, it is difficult to remove all of the water from hydrogen peroxide, and in some cases, substantially anhydrous hydrogen peroxide contains less than 10%, less than 1%, less than 0.1%, less than 0.01%, or less than 0.001% water by weight. In some cases, hydrogen peroxide with a low water content is contained in a hydrogen peroxide source that provides the hydrogen peroxide to a material, and the hydrogen peroxide becomes mixed with water (e.g., from the environment within a process equipment) before interacting with the material (e.g., forming a hydroxyl layer on the surface). In some cases, the hydrogen peroxide in a source or interacting with a material is part of a mixed gas, which can contain other species, such as water. In some cases, the hydrogen peroxide in a source or interacting with a material is mixed with water, wherein the amount of water in the mixture (or mixed gas) by weight is less than 10%, less than 2%, less than 0.5%, less than 0.1%, less than 0.01%, less than 0.001%, or from 10 ppm to 99% by weight, or from 100 ppm to 75% by weight, or from 100 ppm to 35% by weight, or from 0.001% to 99% by weight, or from 1% to 99% by weight, or from 30% to 99% by weight, or from 30% to 75% by weight. In some cases, the hydrogen peroxide in a source or interacting with a material is mixed with a carrier gas, such as nitrogen, argon, air, or hydrogen. Hydrogen peroxide and mixtures thereof are also described in U.S. Pat. Nos. 8,282,708, 9,545,585, and 10,363,497; U.S. Pat. Pub. Nos. US20200291517A1, and US20200393086A1, and International Pub. Nos. WO2016/164380 and WO2017/027581, each of which is incorporated herein by reference in their entireties.

In some embodiments, a hydroxyl layer is formed on a material, which decreases the amount of hydrogen degradation of the material when exposed to hydrogen. For example, the material can be any metal substrate or metal oxide film formed on a substrate (e.g., used in a fabrication process) that may be exposed to hydrogen gas or hydrogen radicals and therefore be subject to hydrogen degradation. The material can be a material upon which a process is being performed (e.g., a silicon wafer, or a multilayer stack of metal oxides and/or semiconductors), or the material can be a material that is part of a piece of process equipment (e.g., a stainless steel wall of a process chamber, or an oxide coated interior surface of a metal pipe) performing a process involving hydrogen. Therefore, the present systems and methods can be used to protect materials being processed, or materials of processing equipment from hydrogen degradation.

The materials upon which a hydroxyl layer is deposited to decrease the amount of hydrogen degradation upon exposure to hydrogen can be bulk materials, materials with a bulk and a coating on the bulk, or materials with multiple layers of coatings forming a multilayer structure (either on a bulk material, or free-standing). The geometry of the materials is not limited, and the material can have planar surfaces, curved surfaces, mesas, trenches, pores, or other geometries. Some examples of materials are metals, metal-oxides, semiconductors, semiconductors coated with metals or metal-oxides, distributed Bragg reflectors (DBRs), and antireflective coatings (ARCs). In some cases, these materials can be parts of semiconductor devices (e.g., processors), optoelectronic devices (e.g., lasers or LEDs), or other types of devices. In some cases, these materials can be parts of processing equipment, such as interior surfaces of vacuum chambers.

Hydrogen degradation (e.g., hydrogen embrittlement) of metals, such as stainless steel, stainless steel alloys, titanium alloys, or aluminum alloys, and hydrogen degradation (e.g. blistering, cracking, or delamination) of coatings such as metal oxides of Si, Al, Ti, In, Zr, Hf, Ta, Ga, Cd, Yt, Nb, lanthanides, and combinations thereof exposed to high energy $H_2$ gas, atomic hydrogen, hydrogen ions, and hydrogen radicals is a typical cause for failure of process chambers, vacuum systems and metal parts under temperature or stress. Some examples of systems with components that can experience hydrogen degradation (e.g., hydrogen embrittlement) are those that are commonly used in semiconductor manufacturing processes, as well as those in medical, pharmaceutical and chemical industries. Hydroxyl layers can be formed on any of the above materials to decrease the amount or rate of hydrogen degradation using the methods and systems described herein.

In some cases, after a material (e.g., a component of a system, or a substrate being processed) experiences repeated or prolonged exposure to hydrogen, cracks and blisters can appear as particles at the nanoscale (e.g., with particle sizes smaller than 1 micron, or smaller than 100 nm, or smaller than 10 nm, or from about 1 nm to about 10 nm, or from about 1 nm to about 20 nm, or from about 1 nm to about 100 nm, or from about 1 nm to about 500 nanometers). These particles can be detrimental to manufacturing processes. For example, in semiconductor wafer processing, particles may be generated in plasma processes which are harmful to thin film performance and ultimately lead to poor device performance.

Previous studies in the art have tried to slow hydrogen embrittlement by, for example, using a thin oxide layer, such as black oxide. However, if hydrogen diffuses through the thin oxide film and/or into the metal substrate, it can later collect at molecular interfaces or grain boundaries to form molecular hydrogen and then hydrogen gas bubbles which can lead to cracks and blisters. It is noteworthy that the passage of hydrogen through a coating depends not only on its diffusivity, but also on the ability of adsorbed hydrogen to recombine into molecular form and escape as bubbles before it is able to enter the coating. The amount or rate of hydrogen ingress can be decreased by the presence of cadmium in the coating because it increases this recombination rate (Bhadeshia HK "Prevention of Hydrogen Embrittlement in Steels" ISIJ International 56 (2016) 24-36).

The present inventors have shown that hydrogen peroxide rapidly decomposes into two hydroxyl groups on reduced metal surfaces.

The hydroxyl density of hydrogen peroxide is much higher than that of water, and hydrogen peroxide typically chemisorbs and does not physisorb like water (Kaufman-Osborn, et al., Surface Science 630 (2014) 273-279; and Edmonds, et al. Surface Science 660 (2017) 31-38, both of which are incorporated herein by reference).

The equation

$$Fe^{2+} + 2H_2O \rightleftharpoons Fe(OH)_2 + 2H^+ \qquad (1)$$

shows that water can liberate hydrogen ions and hydroxylate a metal (e.g., iron) surface. As described herein, in the absence of a hydroxylated surface, atomic hydrogen would lead to an increase in hydrogen degradation of the metal. By adding hydrogen peroxide to the process and forming a hydroxyl layer on the metal, the effect of the degradation due to atomic hydrogen can be decreased. In such a situation, a hydroxyl layer provided on a metal or metal-oxide surface would react with atomic hydrogen to form water (according to the reverse reaction of equation (1) above). The water formed in this (reverse) reaction could then be removed in the gas phase by vacuum or purge gas.

The present disclosure relates to the surface functionalization of materials (e.g., metals and metal-oxides) by hydrogen peroxide to decrease the amount or rate of, or prevent, degradation (e.g., embrittlement) caused by hydrogen (e.g., hydrogen gas, hydrogen atoms, hydrogen ions, hydrogen radicals, or hydrogen plasma). In some cases, the formation of a monolayer coating on a metal surface or thin metal-oxide film using hydrogen peroxide gas decreases the amount or rate of hydrogen degradation (e.g., hydrogen embrittlement) of the metal. Not to be limited by theory, a hydroxyl layer can prevent hydrogen (e.g., atomic hydrogen) from penetrating the surface (or decrease the rate of hydrogen penetration into the surface), thereby preventing (or decreasing the rate of) degradation (e.g., embrittlement, delamination, particle formation, or blistering) of the underlying material.

By dosing the material (e.g., metal or metal oxide) surface exposed to hydrogen (e.g., atomic hydrogen) with hydrogen peroxide gas, an oxide on the surface of the material can be protected from reduction reactions by the hydroxyls on the surface reacting with the hydrogen (according to the reverse reaction of equation (1)) before it can react with and/or diffuse into the material. As such, a surface oxide can be maintained to prevent (or limit) hydrogen (e.g., atomic hydrogen) from penetrating below the surface. In this way the hydrogen degradation (e.g., hydrogen embrittlement) of the material (e.g., metal or metal oxide) can be slowed or prevented. In some cases, a monolayer of hydroxyls on the surface is sufficient to decrease the susceptibility of a material (e.g., a metal or metal oxide) to hydrogen degradation (e.g., hydrogen embrittlement). In some cases, the monolayer of hydrogen peroxide is dense and continuous. In some cases, the hydroxyl monolayer is regenerated by continuous dosing of hydrogen peroxide to replenish a depleted hydroxyl monolayer and prevent (or limit) reduction of the material (e.g., metal oxide surface).

In some cases, the material contains a transparent or conductive oxide, and additional oxide grown on the surface (e.g., to form a protective coating on the transparent or conductive oxide) can degrade the properties of the transparent or conductive oxide. For example, in the case of a DBR mirror or antireflective coating (ARC), the thickness of the layers is important to the optical properties, and growth of an additional oxide on the surface can degrade the optical properties of the DBR or ARC. In some cases, an oxide (e.g., protecting a metal surface) is kept to a minimal thickness on the surface of a material and a layer of hydroxyls is formed on the surface of the material ready to react with any atomic hydrogen that collides with the surface. In other words, using hydrogen peroxide to form a layer of hydroxyls on the surface of a material can enable a protecting oxide layer on the surface of the material to be made thinner than would be possible without forming the layer of hydroxyls on the surface. In some cases, using hydrogen peroxide to form a layer of hydroxyls on the surface of a material can protect the material from hydrogen degradation, such that a protective oxide layer on the surface of the material is not needed to decrease the amount or rate of hydrogen degradation.

In certain cases, the presence of water can cause sub-surface oxidation of a material, which can be detrimental to the material property integrity of the material. Due to Raoult's law, the water in a typical hydrogen peroxide solution preferentially evaporates, thereby increasing the concentration of gaseous hydrogen peroxide evaporating from the solution over time (e.g., which may be undesirable for process control, and may pose health and safety risks). As such, in various embodiments, the present systems and methods provide for surface treatment with hydrogen peroxide with a low water content (e.g., substantially anhydrous hydrogen peroxide) to avoid the detrimental effects of the presence of water where water in high concentration is to be avoided (e.g., due to safety hazards, or processes and/or materials that are sensitive to water). Using a low water content, an anhydrous, or a substantially anhydrous, formulation of hydrogen peroxide enables safe treatment with hydrogen peroxide with minimal water content, thereby allowing for consistent, continuous doses of hydrogen peroxide (e.g., during a controlled process). In some cases, the low water content, anhydrous, or substantially anhydrous hydrogen peroxide may be provided from a non-aqueous liquid source, such as those described in U.S. Pat. No. 9,545,585, which is incorporated by reference herein in its entirety.

In various embodiments, a monolayer of hydroxyls (or a layer of hydroxyls that is thinner or thicker than a monolayer) is added to the material (e.g., metal surface or metal oxide thin film) to protect against hydrogen degradation (e.g., embrittlement or blistering) caused by exposure of the surface to hydrogen (e.g., molecular hydrogen $H_2$, atomic hydrogen $H\cdot$, or a hydrogen plasma $H\cdot^*$). As provided herein, $H\cdot$ designates a free hydrogen atom which is a radical (i.e., contains a reactive unpaired electron) and $H\cdot^*$ designates atomic hydrogen in a higher excited state (e.g., in a plasma).

If the initial material (e.g., surface oxide) is not recharged by exposure to hydroxyls, then hydrogen (e.g., atomic hydrogen) can reduce the material (e.g., surface oxide) to a sub-stoichiometric metal oxide or to a metal. Oxygen removal from a metal oxide may compromise physical and mechanical properties of the metal. In addition, it is well documented that molecular hydrogen or atomic hydrogen exposure to bare metal surfaces can cause embrittlement and lead to mechanical failure. In some cases, atomic hydrogen penetrates through the surface below the thin film and then recombines either at grain boundaries or other location below the surface of the thin film to cause cracking, delamination, and/or blistering due to compositional changes and induced intrinsic stress. Metal-oxides are sometimes used as protective coatings on metal, however they in themselves may also deteriorate over time when exposed to molecular hydrogen or hydrogen radicals. Therefore, regenerable surface functionalization by hydrogen peroxide, in accordance with embodiments of the present disclosure, is a sustainable method for protecting materials that are subject to long term exposure and/or exposure under extreme conditions such as hydrogen gas, hydrogen plasma, reducing atmospheres, and/or elevated temperature.

In some embodiments, during the process that generates hydrogen (e.g., hydrogen radicals), the surface of a material may be periodically regenerated by exposure to hydrogen peroxide gas to replenish surface hydroxyl groups that react with (and are depleted by) the incoming hydrogen (e.g., hydrogen atoms or molecular hydrogen). The hydroxyl groups therefore serve as a sacrificial atomic layer coating which react with hydrogen species to yield water and/or oxygen. This is advantageous over conventional protection methods (e.g., that use oxide coatings) because the protective hydroxyl layer described herein can be replenished in situ (e.g., without removing the material from a processing chamber), whereas conventional protection methods cannot be readily regenerated. For example, an oxide coating could be grown or deposited (e.g., using an oxidation oven, or a sputter coating process) on a substrate to protect the substrate against hydrogen embrittlement in a process chamber. In order to replenish the oxide coating in such a situation, the substrate would have to be removed from the process chamber, the old film would have to be removed without damaging the substrate, and a new oxide coating would have to be grown or deposited (e.g., using a oxidation oven, or a sputter coating process). In contrast, a hydroxyl layer could be used to protect a material in a process chamber, by dosing the material with hydrogen peroxide while in the chamber (e.g., before exposure to hydrogen). In order to replenish the oxide coating in this situation, the substrate could be dosed with additional hydrogen peroxide (e.g., in between periods of hydrogen exposure, or during the hydrogen exposure), which can be done without removing the material from the process chamber. The present systems and methods, therefore, enable a material to be protected from hydrogen degradation (e.g., hydrogen embrittlement) for a longer duration of hydrogen exposure, and/or at lower cost, and/or more efficiently (e.g., with less processing down time), than conventional protection methods.

In some cases, a reducing species (e.g., hydrogen, hydrazine, ammonia, carbon monoxide, or hydrogen sulfide) can cause degradation of the properties of a material. For example, the reducing species can cause a surface oxide to be reduced to a sub-stoichiometric metal-oxide or metal, degrading the properties of the metal-oxide or metal. In some cases, a hydroxyl layer formed from hydrogen peroxide can suppress the degradation of a material due to the reducing species. Not to be limited by theory, in some cases, the hydroxyl layer can react with the reducing species to form byproducts that are not harmful (or are less harmful than the reducing species) to the material.

An example of a metal oxide that can suffer from hydrogen degradation is hafnium oxide ($HfO_2$). Hafnium oxide can be reduced to a sub-stoichiometric oxide due to hydrogen exposure. A layer of hydroxyl on the surface of the hafnium oxide can decrease the amount or rate of hydrogen degradation. Another example of a metal oxide that can suffer from hydrogen degradation is titanium dioxide (e.g., $TiO_2$). Titanium dioxide is transparent, and can be reduced to a sub-stoichiometric oxide due to hydrogen exposure, which can cause the sub-stoichiometric titanium oxide to become less transparent (e.g., some forms of reduced titanium oxide are black). A layer of hydroxyl on the surface of the titanium dioxide can decrease the amount of hydrogen degradation and thereby maintain the optical transparency of the material.

Exposure of materials (e.g., metals and/or metal oxide films) to hydrogen peroxide (or substantially anhydrous hydrogen peroxide) can decrease the amount or rate of hydrogen degradation (e.g., surface degradation, or brittleness) when subsequently exposed to hydrogen (e.g., hydrogen radicals) over time. Accordingly, systems and methods for decreasing hydrogen degradation (e.g., hydrogen embrittlement) are described herein. In some cases, a method for decreasing the amount or rate of hydrogen degradation (e.g., hydrogen embrittlement) includes forming a hydroxyl layer on a material involved in a controlled process or application, by exposing the material to hydrogen peroxide (e.g., hydrogen peroxide gas) prior to, during, or at intermittent periods during the controlled process or application. This method can provide a protective hydroxyl functionalized surface on the material which decreases the amount or rate of hydrogen degradation (e.g., hydrogen embrittlement) of the material.

The following examples are intended to illustrate but not limit the invention.

Example 1

Figure 2:
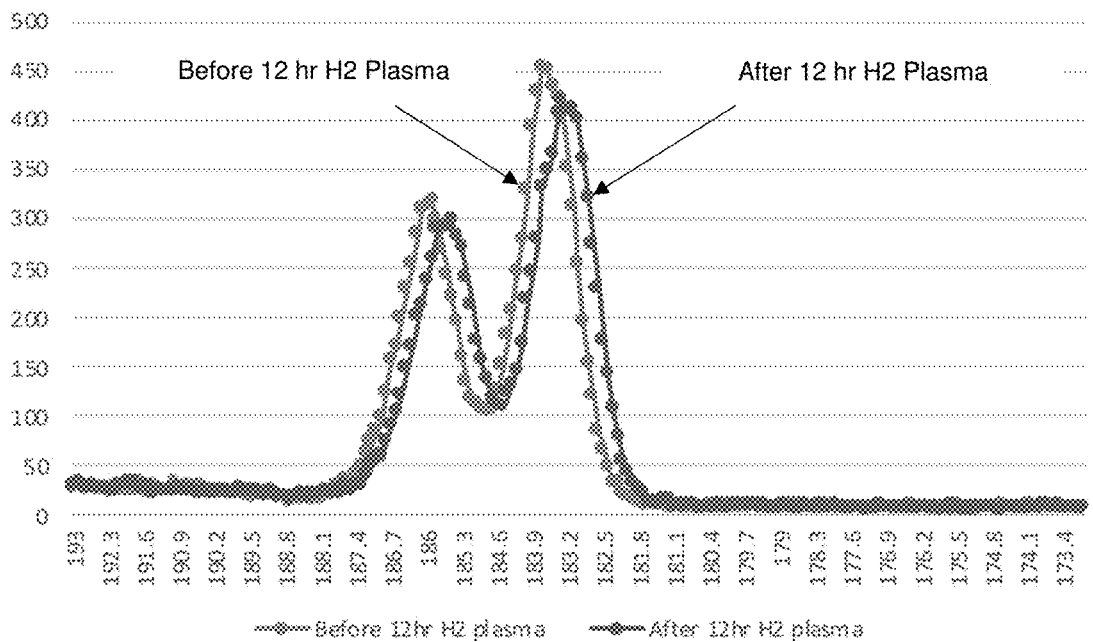
FIG. 2 is a graphical diagram showing the results after 12 h $H_2$ plasma wherein the metal oxide 3d peak shifted to lower binding energy, in accordance with some embodiments.
Figure 3:
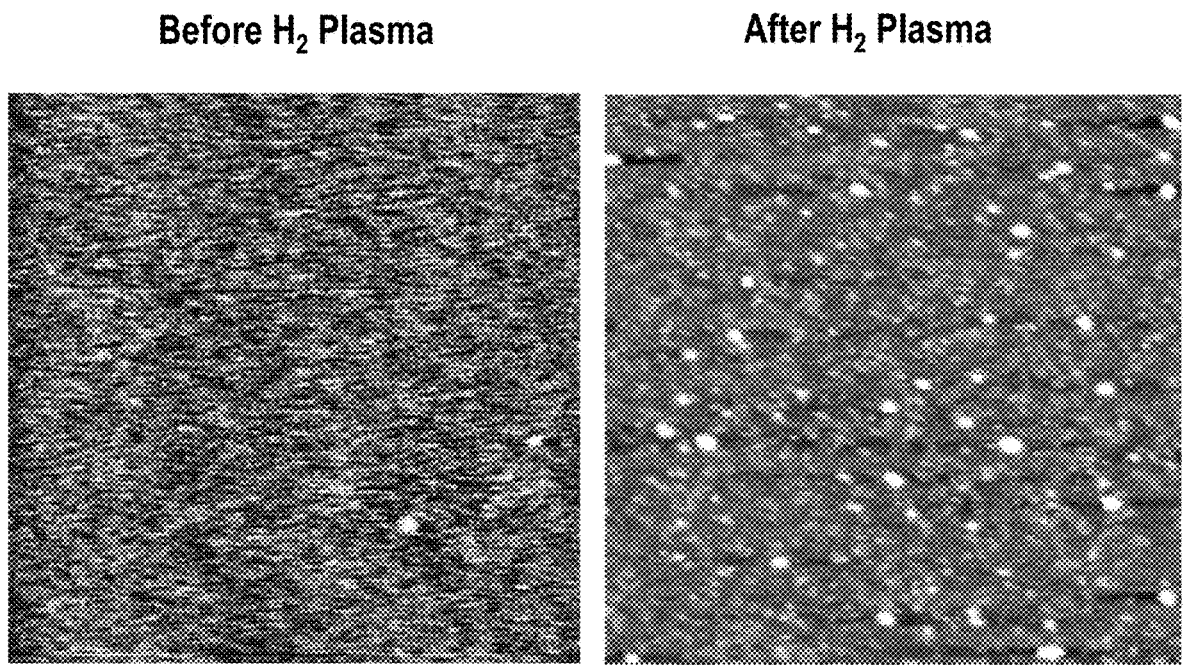
FIG. 3 is a pictorial diagram showing images from an atomic force microscope (AFM) of a film before and after $H_2$ plasma, in accordance with some embodiments.

A control study was performed to demonstrate film degradation due to atomic hydrogen exposure. In this study, a thin metal oxide film was exposed to $H_2$ plasma for 12 hours at a pressure of 160 mTorr at room temperature and 100 watts without $H_2O_2$. FIGS. 1 and 2 are x-ray photoelectron spectroscopy (XPS) results showing an oxygen is peak (in FIG. 1) and a zirconium $3d$ peak (in FIG. 2), before and after the hydrogen plasma exposure. As show in FIGS. 1 and 2, the oxygen is peak and the metal oxide $3d$ peak both shifted to lower binding energy, which is indicative of film degradation. FIG. 3 is a pictorial diagram showing atomic force microscope (AFM) images of the film before and after the $H_2$ plasma exposure. The AFM results showed that the metal oxide film became rougher after the hydrogen exposure, and the root mean square (RMS) roughness increased by around 3.1 angstroms (or a 4× increase). FIG. 3 shows that there was a significant increase in the density of particles (e.g., from about 3 nm to about 5 nm in size) after $H_2$ plasma exposure. It was therefore concluded that $H_2$ plasma damaged the metal oxide surface of the film in this example.

Example 2

Figure 4:
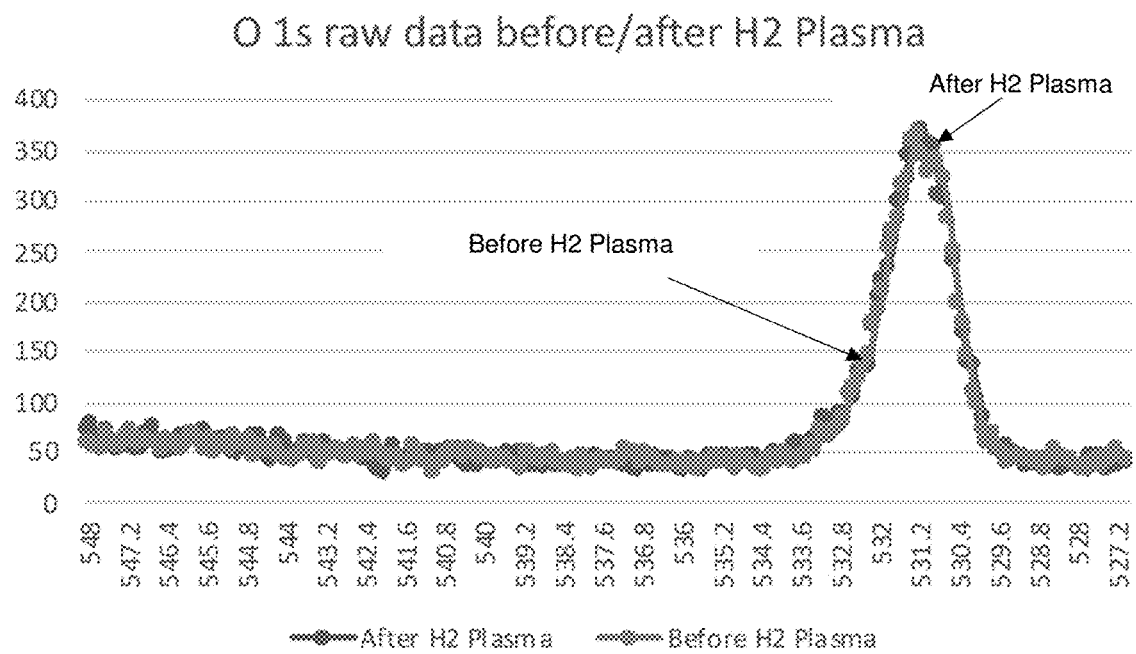
FIG. 4 is a graphical diagram showing the results after a 50 ms pulse of substantially anhydrous hydrogen peroxide ($H_2O_2$) into the vacuum chamber followed by a 10 sec wait time before 10 minutes of $H_2$ plasma, wherein no shift in oxygen peak was observed, in accordance with some embodiments.
Figure 5:
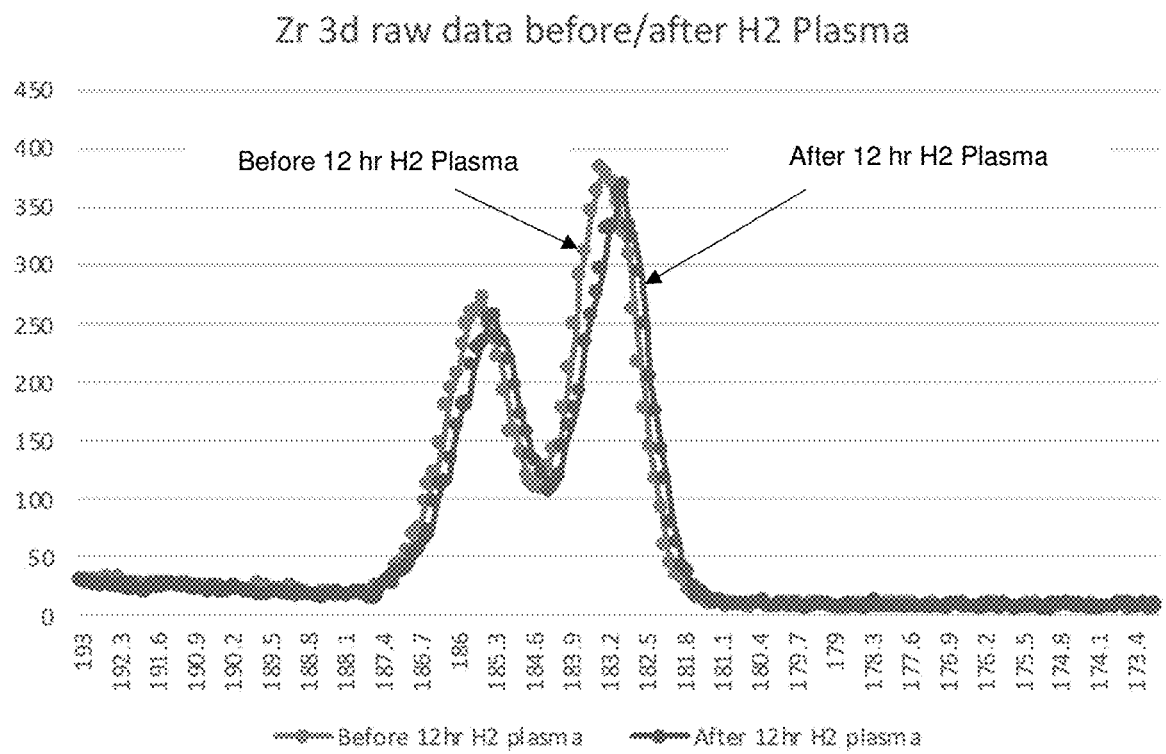
FIG. 5 is a graphical diagram showing a smaller shift as compared to FIG. 2, in accordance with some embodiments.
Figure 6:
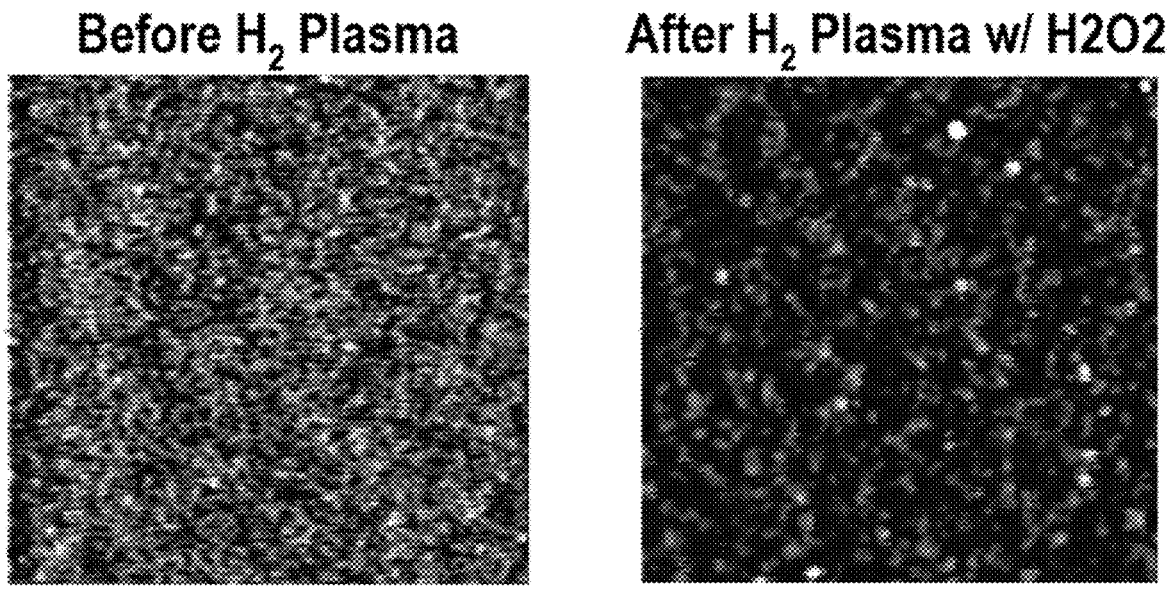
FIG. 6 is a pictorial diagram showing AFM images showing a decrease in film surface roughness after 12 hours of $H_2$ plasma with substantially anhydrous $H_2O_2$ dosing, in accordance with some embodiments.

In this example, an experimental study was performed to demonstrate a decrease in the amount of a metal oxide film degradation due to atomic hydrogen exposure using hydrogen peroxide. In this experimental study, substantially anhydrous $H_2O_2$ was dosed into the vacuum chamber at a pressure of about 2 mTorr, or 100 langmuirs. Dosing was performed at a 50 ms pulse length, and after the pulse a 10 sec wait time was used before turning back on the $H_2$ plasma for 10 minutes at a pressure of about 2 mTorr. This cycle of dosing with $H_2O_2$ followed by hydrogen exposure was repeated for 12 hours. FIGS. 4 and 5 are x-ray photoelectron spectroscopy (XPS) results showing an oxygen is peak (in FIG. 4) and a zirconium $3d$ peak (in FIG. 5), before and after the hydrogen plasma exposure. As shown in FIGS. 4 and 5, no shift in oxygen peak (FIG. 4) and a smaller shift in metal peak (FIG. 5) was observed compared to the shift of the metal $3d$ peak observed in Example 1 (e.g., shown in FIG. 2). These results indicate that the metal oxide layer did not significantly degrade during exposure to $H_2O_2$. FIG. 6 is a pictorial diagram showing AFM images of the film before and after the $H_2$ plasma exposure. FIG. 6 shows that after 12 hours of repeated $H_2$ plasma with $H_2O_2$ dosing cycles, the metal oxide film did became rougher, but the amount of roughening was decreased compared to that of the film in Example 1. The RMS roughness of the film in Example 2 increased from 1.1 angstroms to 3.0 angstroms. Therefore, while some roughing of the film was observed, the amount of increase in RMS roughness after $H_2$ plasma was smaller with the hydrogen peroxide dosing (i.e., the RMS roughness increase was 3.1 angstroms without $H_2O_2$ dosing compared to an increase in 1.9 angstroms with $H_2O_2$ dosing).

Figure 7:
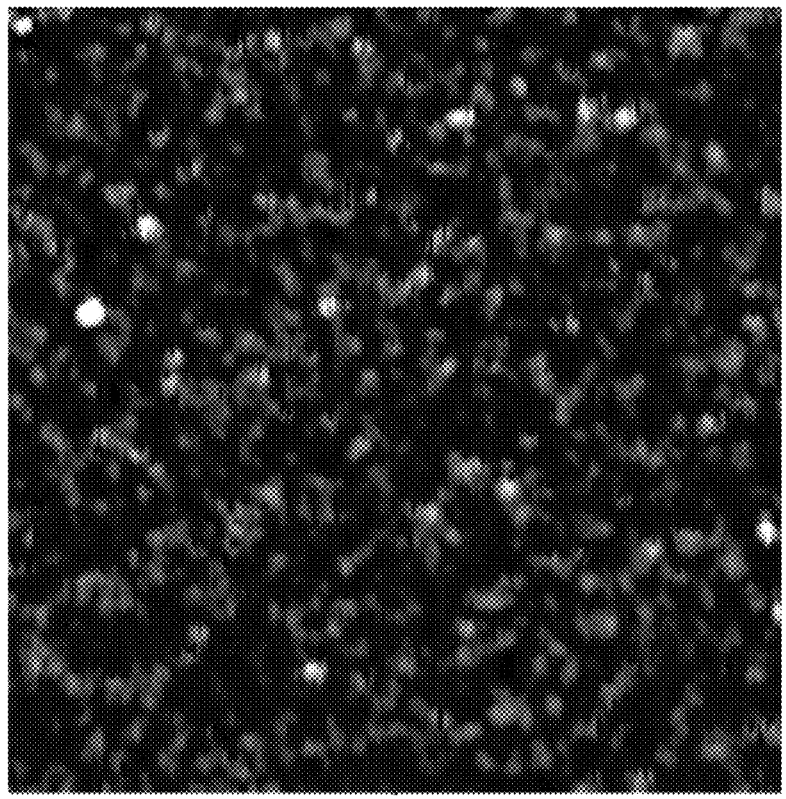
FIG. 7 is a pictorial diagram showing AFM images of a particle (white spots) comparison side-by-side, where there is approximately a 10× decrease in the number of particles after 12 hours of $H_2$ plasma, in accordance with some embodiments.
Figure 7:
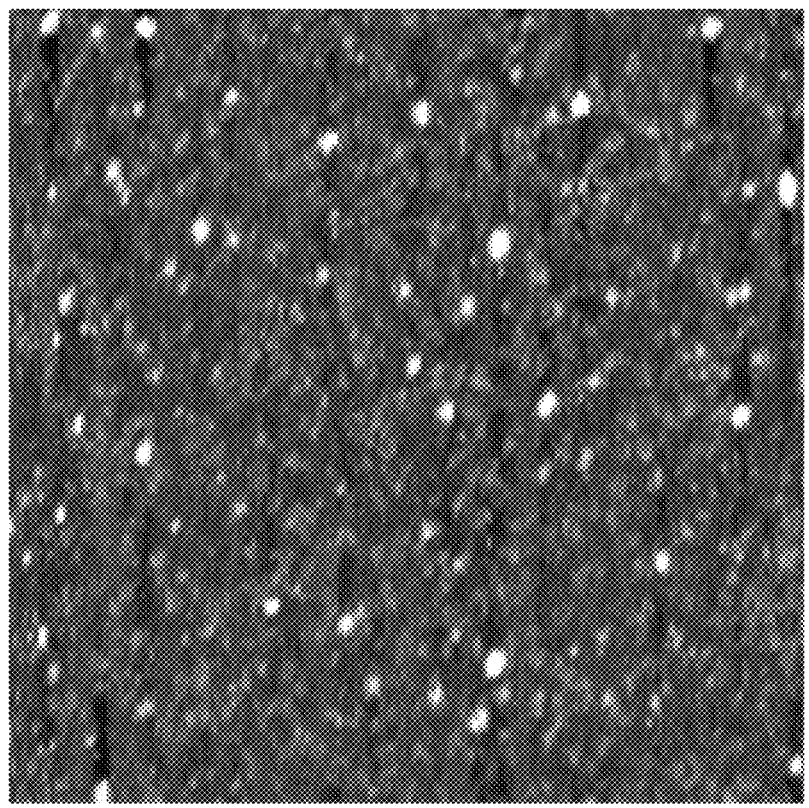

Additionally, particles are an indication of degradation (e.g., embrittlement) of the film as it spalls off from the subsurface. FIG. 7 is a pictorial diagram showing AFM images of the film after the $H_2$ plasma exposure in Example 1 compared to the film after the $H_2$ plasma exposure in Example 2. FIG. 7 shows that there was about a 10× decrease in the number of small (e.g., from about 3 nm to about 5 nm in size) particles (the white spots in FIG. 7) when the doses of $H_2O_2$ were injected into the chamber.

Example 3

A second control study was performed to demonstrate film degradation due to atomic hydrogen exposure. In this study, a thin metal oxide film was formed on an Si substrate, and subsequently was exposed to $H_2$ plasma for 12 hours at a pressure of 160 mTorr at room temperature and 100 watts, without being treated with $H_2O_2$. The XPS data showed no Si peak before hydrogen exposure, but after 12 hours of hydrogen exposure a Si substrate peak was observed. Since XPS is highly surface sensitive, this indicates that the film was being degraded (e.g., thinned, or holes were formed)

during the exposure. In this control example, no change was observed in the Zr $3d$ peak or the O is peak due to the hydrogen exposure.

Figure 8:
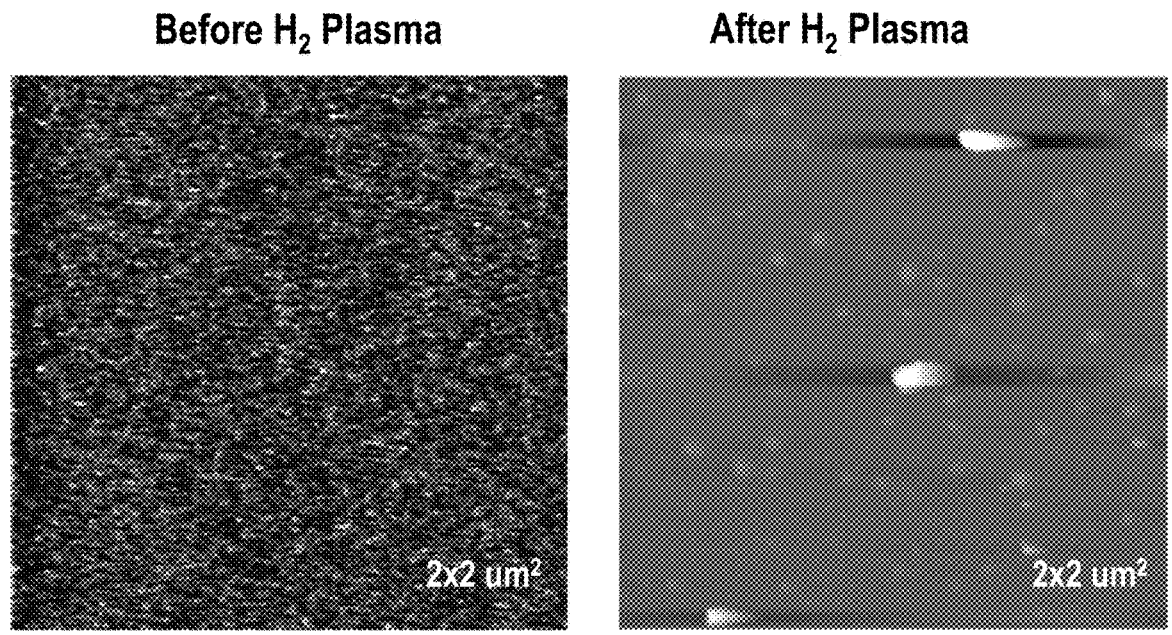
FIG. 8 is a pictorial diagram showing images from an atomic force microscope (AFM) of a film before and after $H_2$ plasma, in accordance with some embodiments.

FIG. 8 is a pictorial diagram showing AFM images of the film before and after the $H_2$ plasma exposure. The AFM results showed that the metal oxide film became rougher after the hydrogen exposure, and the root mean square (RMS) roughness increased from 1.3 angstroms to 22.2 angstroms (approximately a 16× increase). FIG. 8 shows that many small particles (e.g., about 3 nm to 5 nm in height) and some large particles (e.g., approximately 20 nm in height) formed after $H_2$ plasma exposure. It was therefore concluded that $H_2$ plasma damaged the metal oxide surface of the film in this example.

Example 4

In this example, a second experimental study was performed to demonstrate a decrease in the amount of a metal oxide film degradation due to atomic hydrogen exposure using hydrogen peroxide. In this second experimental study, substantially anhydrous $H_2O_2$ was continuously dosed into the vacuum chamber at a pressure from about 8 mTorr to about 10 mTorr, while the metal oxide film was exposed to $H_2$ plasma for 12 hours at a pressure of 160 mTorr at room temperature and 100 watts. In this case, the XPS data showed no Si peak after hydrogen exposure, indicating that there was no significant thinning or holes in the film. The XPS data also showed that there was no change in the Zr $3d$ peak after hydrogen exposure. The XPS data also showed that there was no change in the main O is peak, however, a shoulder on the O is peak was observed after hydrogen exposure.

Figure 9:
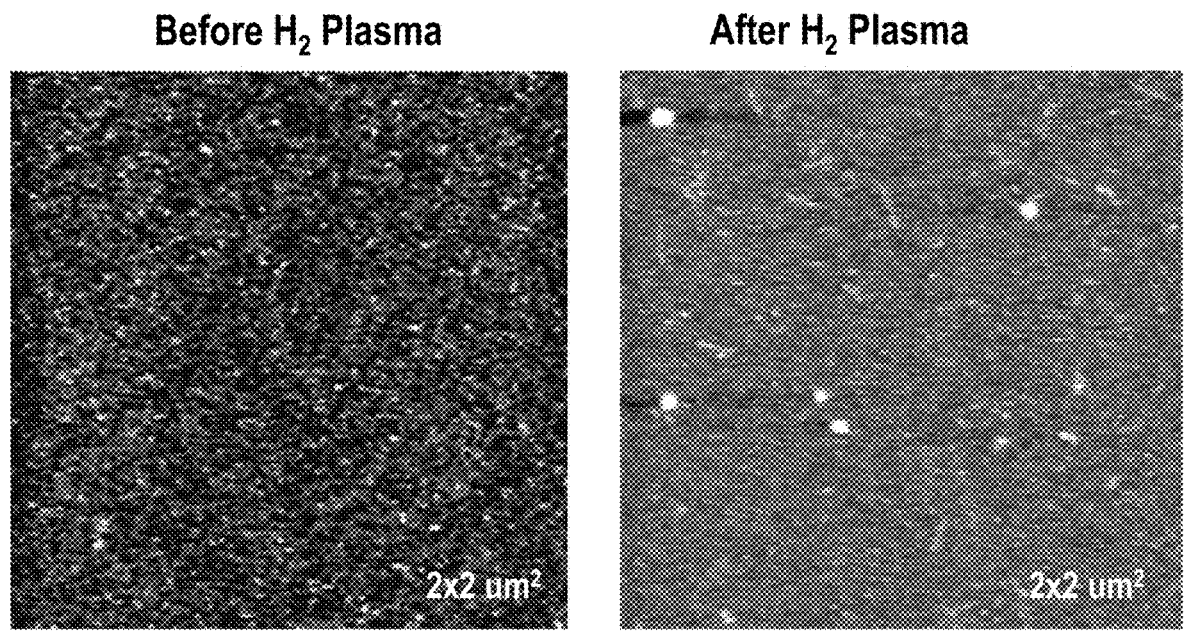
FIG. 9 is a pictorial diagram showing AFM images showing a decrease in film surface roughness after 12 hours of $H_2$ plasma with substantially anhydrous $H_2O_2$ dosing, in accordance with some embodiments.

FIG. 9 is a pictorial diagram showing AFM images of the film in this example before and after the $H_2$ plasma exposure. The AFM results showed that the metal oxide film only became slightly rougher after the hydrogen exposure, and the root mean square (RMS) roughness increased from 1.2 angstroms to 2.2 angstroms (less than a 2× increase). FIG. 9 shows that some small particles (e.g., approximately 3 nm to 5 nm in height) were formed after $H_2$ plasma exposure, however, none of the large particles (e.g., about 20 nm in height) were observed. Therefore, the continuously dosed hydrogen peroxide effectively decreased the amount of degradation of the metal oxide film during the hydrogen exposure.

Figure 10:
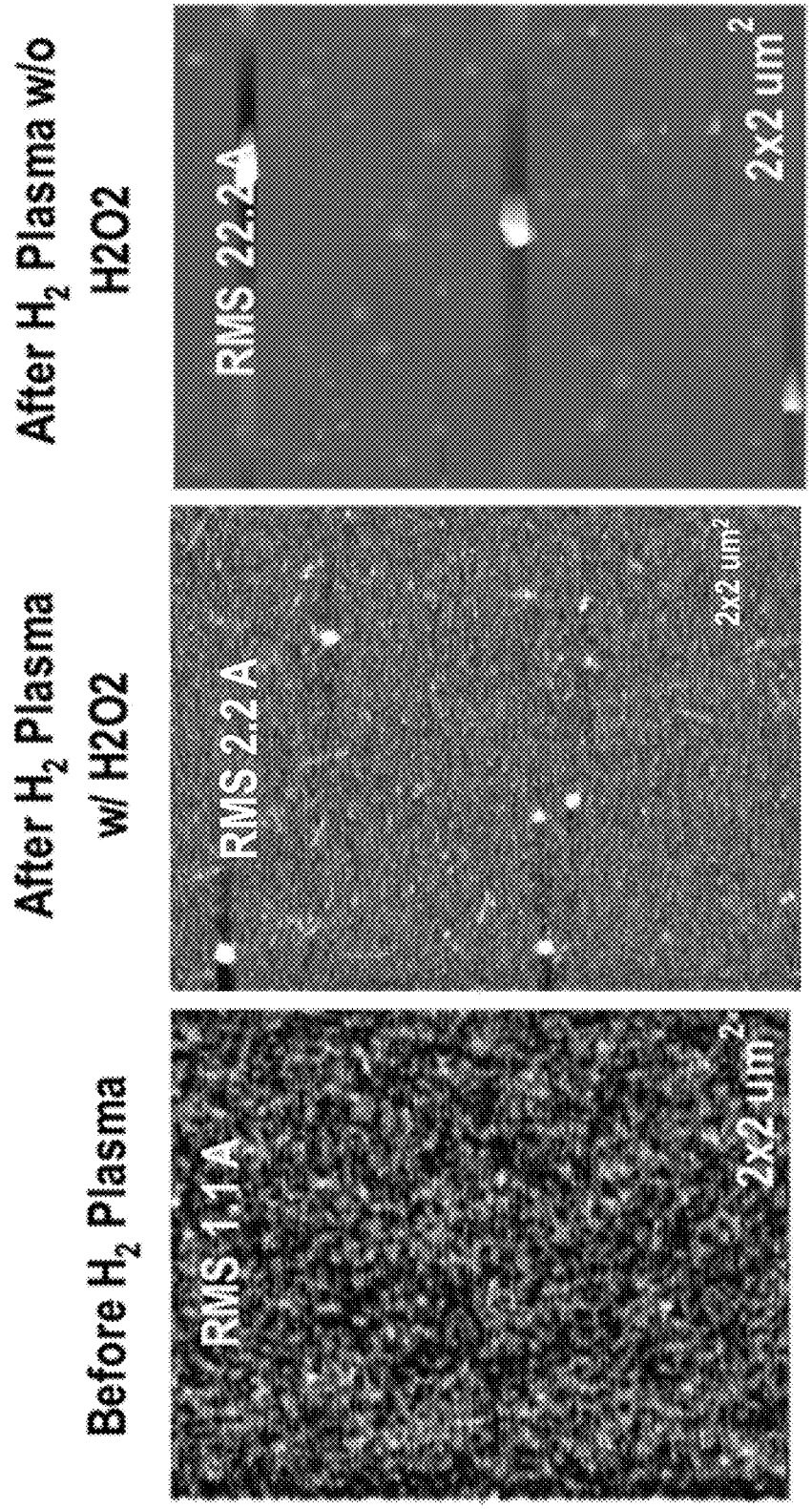
FIG. 10 is a pictorial diagram showing AFM images of a particle (white spots) comparison side-by-side, where there is a decrease in the number of particles after 12 hours of $H_2$ plasma, in accordance with some embodiments.

FIG. 10 is a pictorial diagram showing AFM images of a film before the hydrogen exposure, the film after the $H_2$ plasma exposure in Example 4 ("After $H_2$ Plasma w/$H_2O_2$"), and the film after the $H_2$ plasma exposure in Example 3 ("After $H_2$ Plasma w/o $H_2O_2$"). FIG. 10 shows that there was significantly less change in RMS roughness when hydrogen peroxide was used to decrease the amount of hydrogen degradation of the metal oxide film. FIG. 10 also shows that the use of hydrogen peroxide decreased the amount small particles (e.g., about 3 nm to 5 nm in height) and large particles (e.g., about 20 nm in height) formed during hydrogen exposure.

Example Methods

Figure 11:
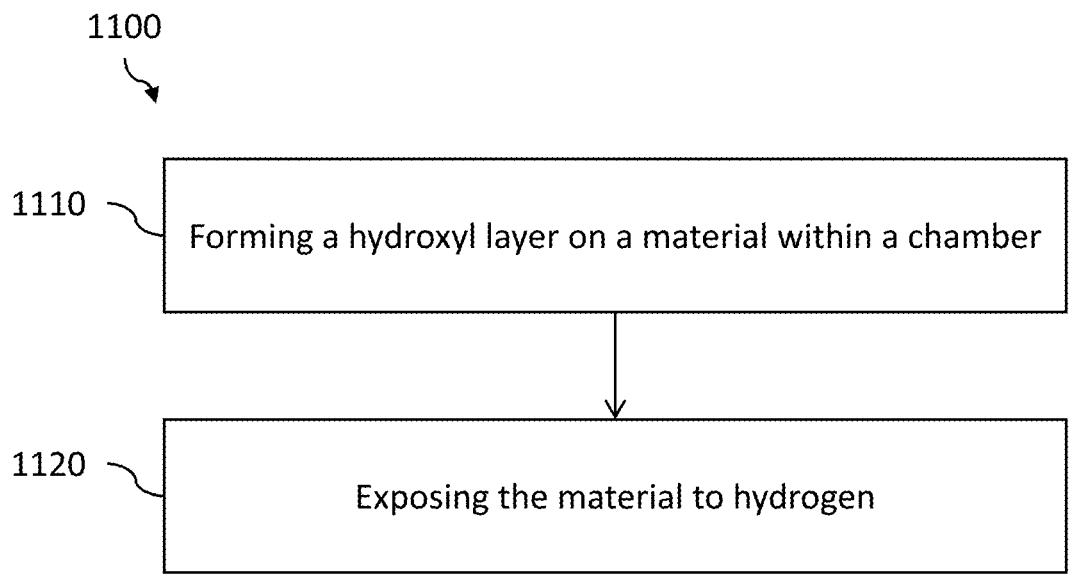
FIGS. 11 and 12 are flowcharts of methods for mitigating hydrogen degradation of a material, in accordance with some embodiments.

FIG. 11 is a flowchart of a method 1100 for decreasing hydrogen degradation of a material. In step 1110, a hydroxyl layer is formed on a material within a chamber (e.g., a vacuum chamber). As described herein, the hydroxyl layer can be formed, for example, using gaseous hydrogen peroxide or substantially anhydrous hydrogen peroxide. In some cases, hydrogen peroxide is used to form the hydroxyl layer on the material in a controlled process, and the reaction byproducts (e.g., water from the hydrogen peroxide reacting with hydrogen) are benign to (or do not significantly impact) the controlled process. In step 1120, the material is exposed to hydrogen (e.g., hydrogen gas, hydrogen plasma, atomic hydrogen, hydrogen ions, and/or hydrogen radicals). The hydroxyl layer formed in step 1110 decreases the amount or rate of hydrogen degradation (e.g., hydrogen embrittlement, delamination, blistering, and/or particle formation).

Figure 12:
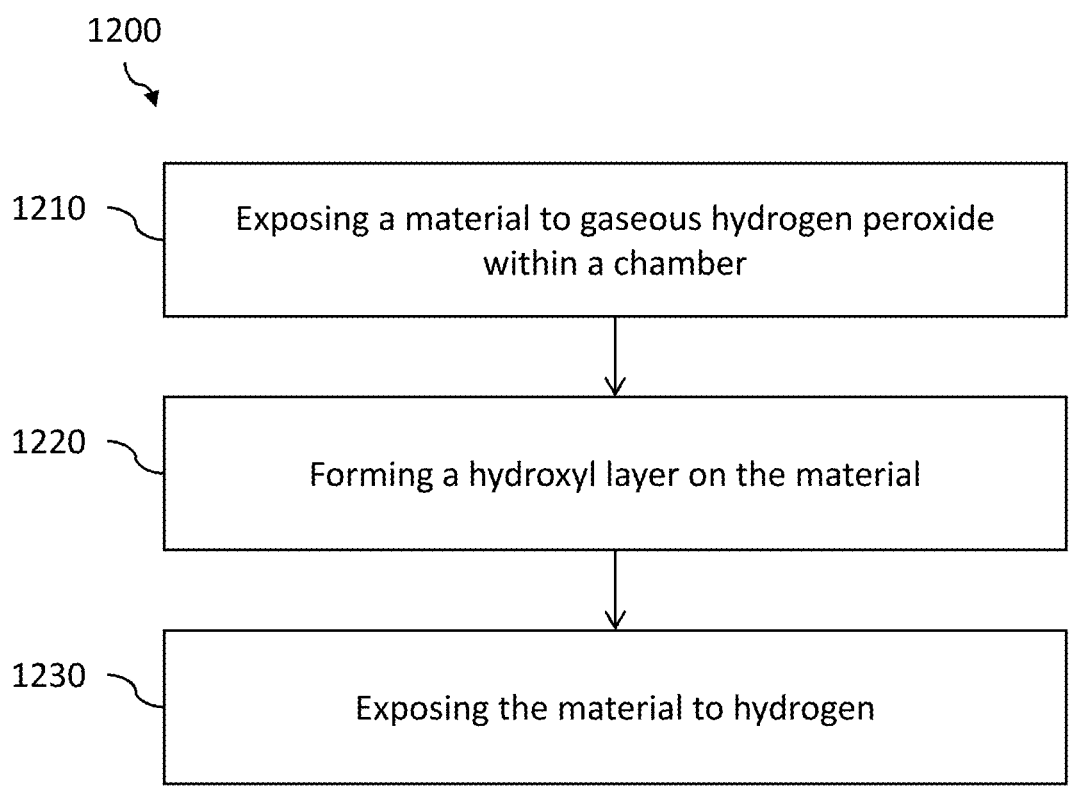

FIG. 12 is a flowchart of a method 1200 for decreasing the amount or rate of hydrogen degradation of a material. In step 1210, a material is exposed to gaseous hydrogen peroxide. In some cases, as described herein, the gaseous hydrogen peroxide can have less than 10% by weight of water, or can be substantially anhydrous. In some cases, the gaseous hydrogen peroxide can also be provided as part of a mixed gas stream comprising the hydrogen peroxide gas and water vapor (e.g., with 100 ppm to 99% by weight hydrogen peroxide concentration). In step 1220, a hydroxyl layer is formed on the material within a chamber (e.g., a vacuum chamber) (similar to step 1110 in method 1100). In step 1230, the material is exposed to hydrogen (e.g., hydrogen gas, hydrogen plasma, atomic hydrogen, hydrogen ions, and/or hydrogen radicals). The hydroxyl layer formed in step 1220 decreases the amount or rate of hydrogen degradation (e.g., hydrogen embrittlement, delamination, blistering, and/or particle formation) of the material caused by the exposure to hydrogen in step 1230.

In various embodiments, forming the hydroxyl layer (e.g., step 1110 in method 1100, or step 1220 in method 1200) comprises exposing the material to gaseous hydrogen peroxide, such as substantially anhydrous hydrogen peroxide gas, or to mixtures of gaseous hydrogen peroxide and water. In some embodiments, the mixed gas stream comprises from 10 ppm to 5% by weight hydrogen peroxide gas, or from 100 ppm to 99% by weight hydrogen peroxide gas. In some embodiments, the mixed gas stream can contain, from 100 ppm to 75% hydrogen peroxide by weight, or from 20% to 40% by weight hydrogen peroxide gas mixed with from 80% to 60% by weight water, such as 30% hydrogen peroxide gas and 70% water by weight. In various embodiments, the step of forming the hydroxyl layer is performed at a temperature from about 0° C. to about 500° C. In some embodiments, the hydrogen peroxide gas is provided at a pressure (or partial pressure) from about 1 mTorr to about 1000 Torr. In some embodiments the hydrogen peroxide gas, or to mixtures of gaseous hydrogen peroxide and water can be directly drawn into the chamber by a pressure differential or vacuum. In some embodiments the hydrogen peroxide gas, or to mixtures of gaseous hydrogen peroxide and water can be carried to the chamber with a carrier gas comprising clean dry air, nitrogen, argon, hydrogen, oxygen, or other inert gases.

In various embodiments, the step of exposing the material to hydrogen peroxide (e.g., step 1110 in method 1100, or steps 1210 and 1220 in method 1200) is repeated to replenish the hydroxyl layer formed on the material. In various embodiments, the step of replenishing the hydroxyl layer is performed at a temperature from about 0° C. to about 500° C. The steps of forming and exposing may be repeated a plurality of times (or may be performed continuously) during the controlled process or application.

In various embodiments, the gaseous hydrogen peroxide is provided (e.g., in step 1210 in method 1200) at a pressure (or partial pressure) from about 2 mTorr to about 76 Torr within an enclosed chamber (e.g., a vacuum chamber). In some embodiments, the gaseous hydrogen peroxide is provided at a pressure from about 1 mTorr to about 100 Torr. In some embodiments, the hydrogen peroxide is dosed at a pulse length from about 2 ms to about 1 min, or about 50 ms. In some embodiments, the hydrogen peroxide is dosed at a pulse length from about 50 ms to about 1 sec. In some embodiments, the hydrogen peroxide is dosed at a pulse length from about 2 sec to about 1 hr. In various embodiments, the hydrogen peroxide is dosed at a pulse length from about 1 hour to about 12 hours. In various embodiments, the hydrogen peroxide is dosed continuously into the chamber (e.g., during exposure to hydrogen in step 1120 of method 1100, or step 1230 of method 1200).

In various embodiments, the material (e.g., in method 1100 or 1200) is selected from the group consisting of metal, such as stainless steel, stainless steel alloys, titanium alloys, aluminum alloys, silicon, or a metal oxide-coated metal, such as metal oxide-coated stainless steel alloys. Metal oxides forming coatings on the materials described herein can include oxides of Si, Al, Ti, In, Zr, Hf, Ta, Ga, Cd, Yt, Nb, lanthanides, and combinations thereof. In various embodiments, the material (e.g., in method 1100 or 1200) is a bulk material, a material with a bulk and a coating on the bulk, or a material with multiple layers of coatings forming a multilayer structure (either on a bulk material, or free-standing). In some embodiments, the chamber (e.g., in step 1110 in method 1200, or in step 1220 in method 1200) is selected from the group consisting of a vacuum chamber, an atomic layer deposition reactor chamber, an etch or a selective etch reactor chamber, a surface cleaning reactor chamber, and a photolithography process chamber.

In various embodiments, the material is exposed to hydrogen (e.g., step 1120 in method 1100, or step 1230 in method 1200) during a controlled process or application. Examples of controlled processes and applications during which the material may be exposed to hydrogen include without limitation microelectronics applications, photolithography, wafer patterning, atomic layer deposition, chemical vapor deposition, etch and selective etch, wafer cleaning, wafer bonding, photoresist stripping, silicon oxidation, surface passivation, photolithography mask cleaning, exposure to UV light, disinfection of surfaces contaminated with bacteria, viruses and other biological agents, industrial parts cleaning, pharmaceutical manufacturing, hydrogenation reactions, production of nano-materials, power generation and control devices, fuel cells, power transmission devices, and any processes that expose metal or metal-oxide surfaces to hydrogen or hydrogen radicals.

In some cases, the hydrogen degradation can be measured by XPS oxygen and/or metal peak shifts of, by AFM RMS roughness changes of, and/or by an increase in the number of particles from, the material caused by the exposure to hydrogen (e.g., in step 1120 of method 1100, or in step 1230 of method 1200).

For example, in some cases a first oxygen peak of a first XPS spectrum of the material measured before the step 1110 in method 1100, or before step 1210 in method 1200, is substantially the same as a second oxygen peak of a second XPS spectrum of the material measured after step 1120 in method 1100, or after setp 1230 in method 1200.

In another example, in some cases a first shift of a first pair of metal peaks of a first pair of XPS spectra of the material measured before step 1110 and after step 1120 in method 1100 is smaller than a second shift of a second pair of metal peaks of a second pair of XPS spectra of a reference material that would be measured before step 1120 and after step 1120 in method 1100 if the reference material did not experience step 1110 before experiencing step 1120 in method 1100.

In another example, in some cases a first shift of a first pair of metal peaks of a first pair of XPS spectra of the material measured before step 1210 and after step 1230 in method 1200 is smaller than a second shift of a second pair of metal peaks of a second pair of XPS spectra of a reference material that would be measured before step 1230 and after step 1230 in method 1200 if the reference material did not experience steps 1210 and 1220 before experiencing step 1230 in method 1200.

In another example, in some cases a first change in root-mean-square (RMS) roughness of the material measured using AFM before step 1110 and after step 1120 in method 1100 is smaller than a second change in surface roughness of a reference material that would be measured using AFM before step 1120 and after step 1120 in method 1100 if the reference material did not experience step 1110 before experiencing step 1120 in method 1100.

In another example, in some cases a first change in root-mean-square (RMS) roughness of the material measured using AFM before step 1210 and after step 1230 in method 1200 is smaller than a second change in surface roughness of a reference material that would be measured using AFM before step 1230 and after step 1230 in method 1200 if the reference material did not experience step 1210 and step 1220 before experiencing step 1230 in method 1200.

Example Systems

Figure 13:
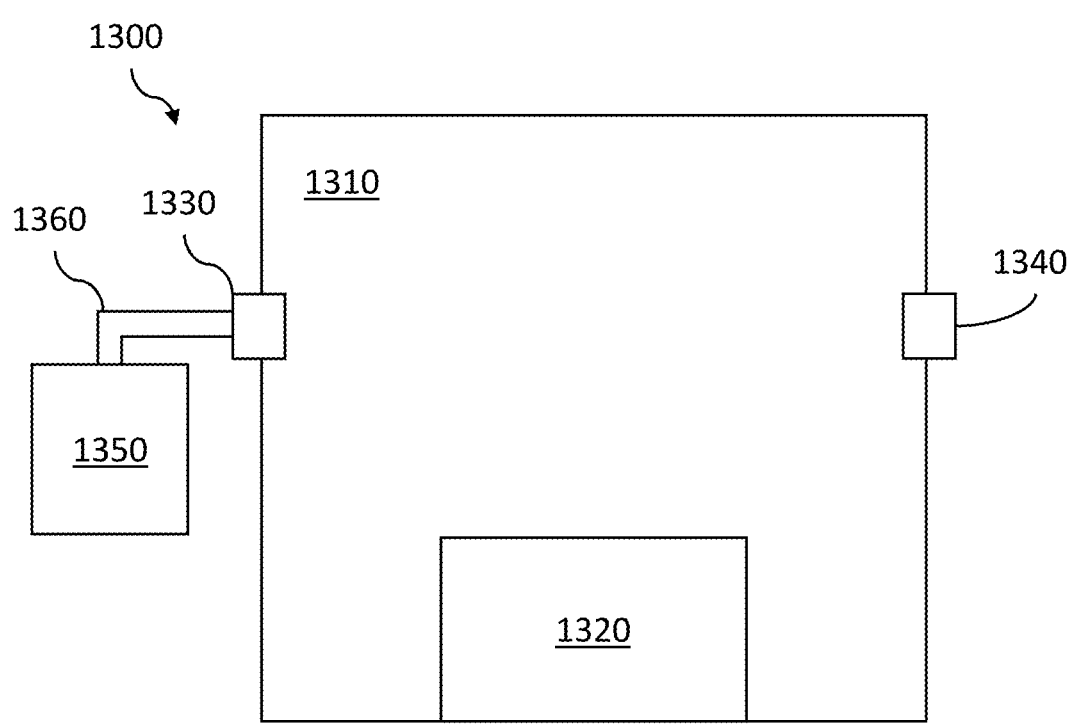
FIG. 13 shows a simplified schematic of an example of a system for decreasing hydrogen degradation of a material, in accordance with some embodiments.

FIG. 13 shows a simplified schematic of an example of a system 1300 for decreasing the amount or rate of hydrogen degradation (e.g., hydrogen embrittlement, delamination, blistering, and/or particle formation) of a material. The system 1300 includes a chamber 1310, with a material 1320 inside the chamber, an inlet 1330 to the chamber for dosing hydrogen peroxide, and an outlet 1340 to the chamber for removing species from the chamber. Some examples of chamber 1310 are a vacuum chamber, an atomic layer deposition reactor chamber, an etch or a selective etch reactor chamber, a surface cleaning reactor chamber, and a photolithography process chamber. The material 1320 can be an article being processed by system 1300, or can be a component of system 1300 in different embodiments. Hydrogen peroxide (e.g., gaseous hydrogen peroxide, substantially anhydrous hydrogen peroxide, or a mixed gas stream containing hydrogen peroxide) can be introduced to the chamber through inlet 1330. In some cases, byproducts (e.g., water) can be removed from chamber 1310 using outlet 1340. The material 1320 can be exposed to hydrogen (not shown) within the chamber 1310. The system 1300 can be used to perform the methods described herein (e.g., method 1100, and method 1200). System 1300 can be used for any of the controlled processes or applications described herein.

In some cases, a hydrogen peroxide source 1350 is coupled to the inlet 1330 via a conduit 1360 to provide the hydrogen peroxide to the chamber 1310. In some cases, the hydrogen peroxide gas can be delivered from an ampoule within source 1350. In some cases, conduit 1360 includes appropriate valving and gas control apparatuses (not shown). The ampoule can contain hydrogen peroxide in a solution or on an adsorbent. In other cases, the hydrogen peroxide source 1350 can be a hydrogen peroxide delivery system including a vapor generation system that replenishes its supply of hydrogen peroxide to enable intermittent or continuous operation. Systems including sources for providing hydrogen peroxide are further described in U.S. Pat. Nos. 8,282,708, 9,545,585, and 10,363,497; U.S. Pat. Pub. Nos. US20200291517A1, and US20200393086A1; and International Pub. Nos. WO2016/164380 and WO2017/027581, each of which is incorporated herein by reference in their entireties.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

Although the invention has been described with reference to the above example, it will be understood that modifications and variations are encompassed within the spirit and scope of the invention. Accordingly, the invention is limited only by the following claims.

What is claimed is:

1. A method for decreasing an amount or rate of hydrogen degradation of a material, comprising:
   (a) exposing a material to gaseous hydrogen peroxide, wherein the material comprises a metal oxide; and
   (b) forming a hydroxyl layer on a surface of the material within a chamber;
   wherein the hydroxyl layer decreases an amount or rate of hydrogen degradation of the material when exposed to hydrogen.

2. The method of claim 1, further comprising, replenishing the hydroxyl layer formed on the material in steps (a) and (b) by continuously exposing the material to the gaseous hydrogen peroxide.

3. The method of claim 1, wherein the material is exposed to the gaseous hydrogen peroxide for a pulse length from 2 ms to 1 min.

4. The method of claim 3, further comprising:
   waiting for a duration of time, after the exposing the material to the gaseous hydrogen peroxide and after the forming the hydroxyl layer on the surface of the material; and
   exposing the material to the hydrogen, after the waiting.

5. The method of claim 4, wherein the duration of time is 10 seconds.

6. The method of claim 4, further comprising repeating steps (a) and (b), after the exposing the material to the hydrogen.

7. The method of claim 1, wherein the gaseous hydrogen peroxide contains less than 95% water.

8. The method of claim 1, wherein the gaseous hydrogen peroxide is provided in a mixed gas stream comprising the gaseous hydrogen peroxide and water vapor.

9. The method of claim 1, wherein the gaseous hydrogen peroxide is provided in a mixed gas stream comprising the gaseous hydrogen peroxide and a carrier gas.

10. The method of claim 9, wherein the carrier gas comprises hydrogen, nitrogen, argon, air, or combinations thereof.

11. The method of claim 1, wherein the material comprises a metal.

12. The method of claim 1, wherein the material comprises a metal oxide comprising one or more of Si, Al, Ti, In, Zr, Hf, Ta, Ga, Cd, Yt, Nb, or a lanthanide.

13. The method of claim 1, wherein the material comprises stainless steel, or a stainless steel alloy.

14. The method of claim 1, wherein the material comprises a titanium alloy or an aluminum alloy.

15. The method of claim 1, wherein the material comprises a metal oxide coated metal.

16. The method of claim 1, wherein the material comprises multiple layers including a metal oxide layer.

17. The method of claim 1, wherein the material comprises multiple layers including a semiconductor layer.

18. The method of claim 1, wherein the material comprises mesas, trenches, pores, via, composite material, or a combination thereof.

19. The method of claim 1, wherein the material comprises a part of a semiconductor device, a part of a processor, a part of an optoelectronic device, a part of a laser, or a part of an LED.

20. The method of claim 1, wherein the metal oxide is on a Si substrate.

21. The method of claim 1, wherein the material comprises an article being processed within the chamber, or a component of the chamber.

22. The method of claim 1, wherein the chamber is selected from a group consisting of an atomic layer deposition reactor chamber, chemical vapor deposition reaction chamber, an etch reactor chamber, a selective etch reactor chamber, a surface cleaning reactor chamber, and a photolithography process chamber.

23. The method of claim 1, wherein a first amount of particles generated when the material is exposed to the hydrogen is less than a second amount of particles that would be generated when the material is exposed to the hydrogen if the material did not experience steps (a) or (b) before being exposed to the hydrogen.

24. A method for decreasing an amount or rate of hydrogen degradation of a material, comprising:
   (a) exposing a material to gaseous hydrogen peroxide for a pulse length from 2 ms to 1 min;
   (b) forming a hydroxyl layer on a surface of the material within a chamber;
   (c) waiting for a duration of time, after the exposing the material to the gaseous (c) hydrogen peroxide and after the forming the hydroxyl layer on the surface of the material; and
   (d) exposing the material to hydrogen, after the waiting;
   wherein the hydroxyl layer decreases an amount or rate of hydrogen degradation of the material when exposed to the hydrogen.

25. The method of claim 24, further comprising repeating steps (a) and (b), after the exposing the material to the hydrogen.

* * * * *